(12) United States Patent  (10) Patent No.: US 9,201,108 B2
Yun et al.  (45) Date of Patent: Dec. 1, 2015

(54) METHOD OF ANALYZING COUPLING EFFECT BETWEEN SIGNAL LINES IN AN INTEGRATED CIRCUIT

(71) Applicant: Samsung Electronics Co., Ltd., Suwon-si (KR)

(72) Inventors: Yeo-Il Yun, Hwaseong-si (KR); Seong-Uk Min, Uiwang-si (KR); Sang-Ho Park, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 329 days.

(21) Appl. No.: 13/728,124

(22) Filed: Dec. 27, 2012

(65) Prior Publication Data

US 2013/0169292 A1    Jul. 4, 2013

(30) Foreign Application Priority Data

Dec. 28, 2011  (KR) ........................ 10-2011-0144426

(51) Int. Cl.
  *G01R 29/26*  (2006.01)
  *G01R 27/28*  (2006.01)
  *G01R 31/28*  (2006.01)
  *G01R 31/317*  (2006.01)

(52) U.S. Cl.
  CPC ............... *G01R 27/28* (2013.01); *G01R 29/26* (2013.01); *G01R 31/2853* (2013.01); *G01R 31/31708* (2013.01); *G01R 31/31717* (2013.01)

(58) Field of Classification Search
  CPC ............................... G01R 29/26; G01R 27/28
  USPC .......................................................... 324/613
  See application file for complete search history.

(56) References Cited

U.S. PATENT DOCUMENTS

| | | | | |
|---|---|---|---|---|
| 4,890,022 | A * | 12/1989 | Endo | 327/261 |
| 7,469,391 | B2 * | 12/2008 | Carrere et al. | 716/115 |
| 2003/0217344 | A1 * | 11/2003 | Ito et al. | 716/6 |
| 2005/0251354 | A1 * | 11/2005 | Guo et al. | 702/79 |
| 2006/0230374 | A1 * | 10/2006 | Sakamoto | 716/6 |
| 2007/0047733 | A1 * | 3/2007 | Bremer et al. | 379/416 |

FOREIGN PATENT DOCUMENTS

| | | |
|---|---|---|
| JP | 2004-280439 | 10/2004 |
| JP | 2008-020986 | 1/2008 |
| JP | 2009-003654 | 1/2009 |

* cited by examiner

*Primary Examiner* — Jeff Natalini
(74) *Attorney, Agent, or Firm* — Myers Bigel Sibley & Sajovec, PA

(57) ABSTRACT

Second signal lines are selected among neighboring signal lines near a first signal line, such that the second signal lines have valid coupling capacitances with respect to the first signal line. Test signal patterns of the first signal line and the second signal lines are selected among real signal patterns according to a function of the integrated circuit. At least one of a coupling noise and a coupling transition delay of the first signal line is calculated based on the test signal patterns.

18 Claims, 11 Drawing Sheets

METHOD OF ANALYZING COUPLING EFFECT BETWEEN SIGNAL LINES IN AN INTEGRATED CIRCUIT

CROSS-REFERENCE TO RELATED APPLICATION

This application claims priority under 35 USC §119 to Korean Patent Application No. 10-2011-0144426, filed on Dec. 28, 2011, in the Korean Intellectual Property Office (KIPO), the contents of which are herein incorporated by reference in their entirety.

BACKGROUND

1. Technical Field

Example embodiments relate generally to an integrated circuit, and more particularly to a method of analyzing coupling effect between signal lines in an integrated circuit.

2. Description of the Related Art

Neighboring signal lines included in an integrated circuit may interfere mutually depending on disposition of the signal lines according to the design of the integrated circuit. Such interference may be referred to as coupling effect that may become serious as the integration degree of a circuit increases. The coupling effect between the signal lines may be modeled using coupling capacitances between the signal lines and the coupling effect is generally analyzed with respect to the worst case regardless of design and operation of the integrated circuit. It is difficult to provide an exact coupling effect according to such conventional methods without considering the real operation of the integrated circuit.

SUMMARY

Some example embodiments provide a method of analyzing coupling effect between signal lines in an integrated circuit to provide an exact coupling effect conforming to a real operation of the integrated circuit.

To analyze coupling effect between signal lines in an integrated circuit according to example embodiments, second signal lines are selected among neighboring signal lines near a first signal line, such that the second signal lines have valid coupling capacitances with respect to the first signal line. Test signal patterns of the first signal line and the second signal lines are selected among real signal patterns according to a function of the integrated circuit. At least one of a coupling noise and a coupling transition delay of the first signal line is calculated based on the test signal patterns.

The second signal lines may be selected by calculating coupling capacitances between the first signal line and the neighboring signal lines, and selecting the neighboring signal lines having the valid coupling capacitances greater than a reference value, as the second signal lines.

The test signal patterns may be selected by selecting first signal patterns among the real signal patterns, the first signal patterns corresponding to cases when a signal level of the first signal line is maintained, selecting second signal patterns among the real signal patterns, the second signal patterns corresponding to cases when the signal level of the first signal line is transitioned, selecting a first test signal pattern among the first signal patterns, and selecting a second test signal pattern among the second signal patterns.

Each of the first test signal pattern and the second test signal pattern may be selected by calculating grade values with respect to the first signal patterns and the second signal patterns, each grade value indicating coupling interference degree of the second signal lines on the first signal line, and selecting the first test signal pattern and the second test signal pattern based on the grade values.

The grade values may be calculated based on at least one of the coupling capacitances between the first signal line and the second signal lines, voltage levels of the second signal lines and signal transition directions of the second lines.

The coupling noise of the first signal line may be calculated based on the first test signal pattern, and the coupling transition delay of the first signal line may be calculated based on the second test signal pattern.

Each of the first test signal pattern and the second test signal pattern may include signal level information and signal transition information of the first signal line and the second signal lines.

The test signal patterns may include a first test signal pattern and a second test signal pattern, the first test signal pattern is selected among first signal patterns corresponding to cases when a signal level of the first signal line is maintained, and the second test signal pattern is selected among second signal patterns corresponding to cases when the signal level of the first signal line is transitioned.

The at least one of the coupling noise and the coupling transition delay of the first signal line may be calculated by rearranging signal transition timings of the second signal lines based on a signal transition timing of the first signal line, and calculating the coupling transition delay of the first signal line based on the rearranged signal transition timings.

When a signal level of the first signal line transitions from a first signal level to a second signal level, the signal transition timings of the second signal lines may be rearranged to a time point when the signal level of the first signal line reaches a third signal level between the first signal level and the second signal level.

When a signal level of the first signal line transitions from a first signal level to a second signal level through a plurality of intermediate signal levels between the first signal level and the second signal level, the coupling transition delay may correspond to a maximum delay among a plurality of level-reaching delays with respect to the intermediate signal levels.

When a signal level of the first signal line transitions from a first signal level to a second signal level through a plurality of intermediate signal levels between the first signal level and the second signal level, the coupling transition delay of the first signal line may be calculated by calculating first signal transition times for the signal level of the first signal line to reach the intermediate signal levels without considering the valid coupling capacitances of the second signal lines, calculating second signal transition times for the signal level of the first signal line to reach the intermediate signal levels by considering the valid coupling capacitances of the second signal lines, and calculating the coupling transition delay of the first signal line based on the first transition times and the second transition times.

The coupling transition delay of the first signal line may be calculated by calculating a plurality of level-reaching delays, each level-reaching delay being a difference between the first transition time and the second transition time for reaching each intermediate signal level, and determining a maximum delay among the level-reaching delays as the coupling transition delay.

The real signal patterns according to the function of the integrated circuit may be combinations of signal waveforms that occur on the first signal line and the second signal lines while the integrated circuit performs a normal operation.

To analyze coupling effect between signal lines in an integrated circuit according to example embodiments, second signal lines may be selected among neighboring signal lines near a first signal line based on coupling capacitances between the first signal line and the neighboring signal lines, first signal patterns and second test signal patterns of the first signal line and the second signal lines may be selected among real signal patterns according to a function of the integrated circuit, the first signal patterns corresponding to cases when a signal level of the first signal line is maintained, the second signal patterns corresponding to cases when the signal level of the first signal line is transitioned. A first test signal pattern may be selected among the first signal patterns and a second test signal pattern may be selected among the second signal patterns. A coupling noise of the first signal line may be calculated based on the first test signal pattern and a coupling transition delay of the first signal line may be calculated based on the second test signal pattern.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
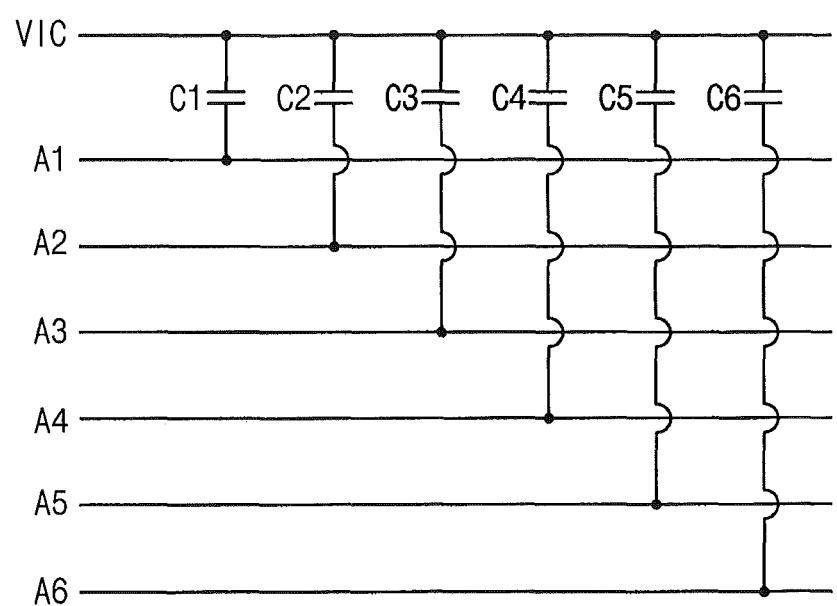
FIG. 1 is a diagram illustrating signal lines in an integrated circuit having coupling effect.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout the description.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present invention may be embodied as methods, systems, and/or computer program products. Accordingly, the present invention may be embodied in hardware and/or in software (including firmware, resident software, micro-code, etc.). Furthermore, the present invention may take the form of a computer program product comprising a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

FIG. 1 is a diagram illustrating signal lines in an integrated circuit having coupling effect.

Referring to FIG. 1, an integrated circuit may include a first signal line VIC and neighboring signal lines A1 through A6 near the first signal line VIC. FIG. 1 illustrates the six neighboring signal lines A1 through A6 for convenience of illustration and the number of the neighboring signal lines may be variously changed. In analyzing the coupling effect on the first signal line VIC due to the neighboring signal lines A1 through A6, the first signal line VIC may be referred to as a victim line and the neighboring signal lines may be referred to as aggressor lines.

The neighboring signal lines A1 through A6 may have coupling capacitances C1 through C6, respectively, with respect to the first signal line VIC. The coupling capacitances C1 through C6 may be varied depending on the design of the integrated circuit and may be calculated using various simulation programs. Hereinafter, for convenience of description, it is assumed that the coupling capacitances C1 through C6 are sequentially increased such that the coupling capacitance C1 between the first signal line VIC and the first neighboring signal line A1 has the greatest value and the coupling capacitance C6 between the first signal line VIC and the sixth neighboring signal line A6 has the smallest value.

The integrated circuit including the signal lines may be various semiconductor circuits such as a processor, a memory device, etc. The memory device may include volatile memory devices, such as a dynamic random access memory (DRAM), a static random access memory (SRAM), a mobile DRAM, or non-volatile memory devices such as an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM). The memory device may be included in memory modules such as dual in-line memory module (DIMM), a single in-line memory module (SIMM), a rambus in-line memory module (RIMM), an unbuffered dual in-line memory module (UDIMM), a registered dual in-line memory module (RDIMM), a fully buffered dual in-line memory module (FBDIMM), and a load reduced dual in-line memory module (LRDIMM).

Figure 2:
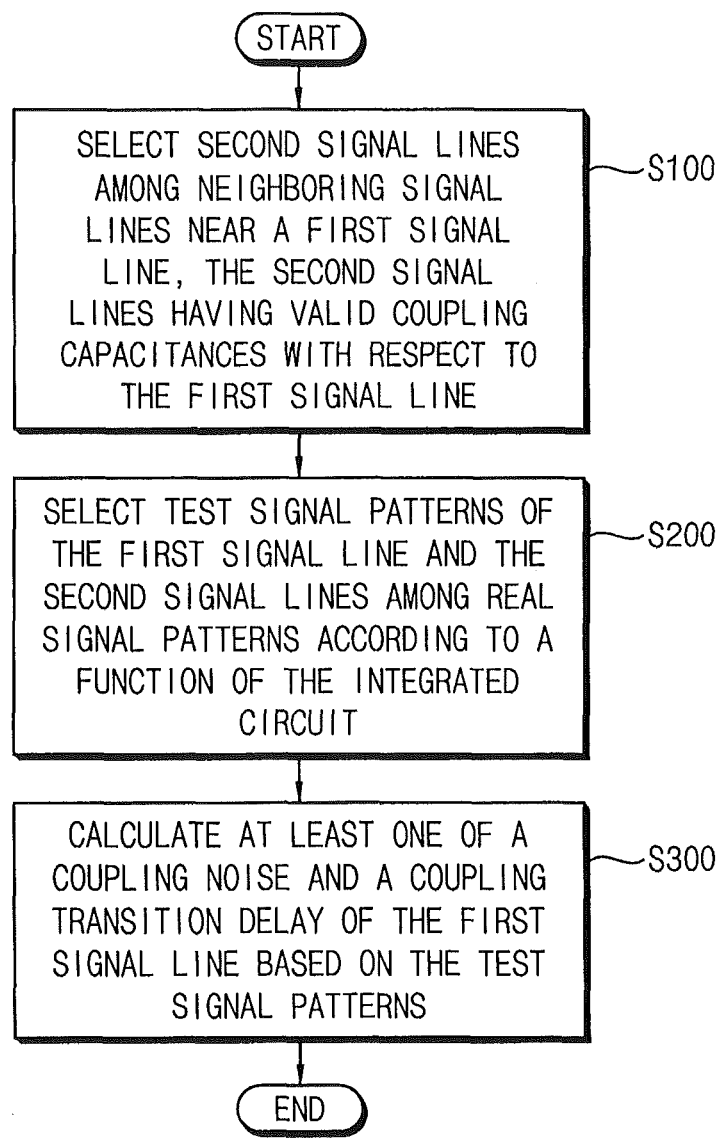
FIG. 2 is a flowchart illustrating a method of analyzing coupling effect between signal lines in an integrated circuit according to example embodiments of the inventive concept.

FIG. 2 is a flowchart illustrating a method of analyzing coupling effect between signal lines in an integrated circuit according to example embodiments of the inventive concept.

Referring to FIGS. 1 and 2, to analyze coupling effect on the first signal line VIC, second signal lines may be selected among neighboring signal lines A1 through A6 near a first signal line VIC (block S100). For example, the four neighboring signal lines A1 through A4 having valid coupling capacitances C1 through C4 with respect to the first signal line VIC may be selected as the second signal lines. In an example embodiment, the coupling capacitances C1 through C6 between the first signal line VIC and the neighboring signal lines A1 through A6 may be calculated and the neighboring signal lines A1 through A4 having the valid coupling capacitances C1 through C4 greater than a reference value may be selected as the second signal lines.

Test signal patterns of the first signal line VIC and the second signal lines A1 through A4 may be selected among real signal patterns according to a function of the integrated circuit (block S200). The real signal patterns according to the function of the integrated circuit represent signal patterns that may actually occur on the first signal line VIC and the second signal lines A1 through A4 during a normal operation of the integrated circuit. The real signal patterns according to the function of the integrated circuit may be combinations of signal waveforms that may occur on the first signal line VIC and the second signal lines A1 through A4 while the integrated circuit performs normal operations.

First signal patterns may be selected among the real signal patterns such that the first signal patterns correspond to cases when a signal level of the first signal line VIC is maintained. In addition, second signal patterns may be selected among the real signal patterns such that the second signal patterns correspond to cases when the signal level of the first signal line VIC is transitioned. For example, the second signal patterns may include the rising-edge cases when the signal level of the first signal line VIC transitions from a logic low level to a logic high level and the falling-edge cases when the signal level of the first signal line VIC transitions from a logic high level to a logic low level. A first test signal pattern may be selected among the first signal patterns, and a second test signal pattern may be selected among the second signal patterns. The first and second test signal patterns may include signal level information and/or signal transition information of the first signal line VIC and the second signal lines A1 through A4.

At least one of a coupling noise and a coupling transition delay of the first signal line VIC may be calculated based on the test signal patterns (block S300). For example, the coupling noise of the first signal line VIC due to the second signal lines A1 through A4 may be calculated based on the first test signal pattern and the coupling transition delay of the first signal line VIC due to the second signal lines A1 through A4 may be calculated based on the second test signal pattern.

In calculating the coupling noise and the coupling transition delay of the first signal line VIC due to the second signal lines A1 through A4, signal transition timings of the second signal lines A1 through A4 may be rearranged based on a signal transition timing of the first signal line VIC or a signal transition timing of one of the second signal lines A1 through A4. The simulation of the integrated circuit may be performed based on the rearranged signal transition timings, and the coupling noise and the coupling transition delay may be calculated from the result of the simulation. For example, when a signal level of the first signal line VIC transitions from a first signal level to a second signal level, the signal transition timings of the second signal lines A1 through A4 may be rearranged to a time point when the signal level of the first signal line VIC reaches a third signal level between the first signal level and the second signal level. For example, when the signal level of the first signal line VIC transitions from a logic low level of 0V to a logic high level of 5V (that is, a rising edge), the signal transition timings of the second signal lines A1 through A4 may be rearranged to a time point when the signal level of the first signal line VIC reaches 2.5V, that is, the average level of the logic low level and the logic high level. In case of a falling edge, the first logic level may be the logic high level and the second logic level may be the logic low level.

In calculating the coupling transition delay of the first signal line VIC due to the second signal lines A1 through A4, signal transition times for the signal level of the first signal line VIC may be calculated by considering and without considering the valid coupling capacitances C1 through C4 of the second signal lines A1 through A4 and then the coupling transition delay may be calculated based on the signal transition times. When a signal level of the first signal line VIC transitions from a first signal level to a second signal level through a plurality of intermediate signal levels between the first signal level and the second signal level, first signal transition times for the signal level of the first signal line VIC to reach the intermediate signal levels may be calculated without considering the valid coupling capacitances C1 through C4 of the second signal lines A1 through A4. In addition, second signal transition times for the signal level of the first signal line VIC to reach the intermediate signal levels may be calculated by considering the valid coupling capacitances C1 through C4 of the second signal lines A1 through A4. The coupling transition delay of the first signal line VIC due to the second signal lines A1 through A4 may be calculated based on the first transition times and the second transition times. For example, when the signal level of the first signal line VIC transitions from a logic low level of 0V to a logic high level of 5V, three intermediate signal levels may be selected as 1V, 2.5V and 4V. The three first transition times and the three second transition times may be calculated with respect to the three intermediate signal levels. Three level-reaching delays may be calculated and a maximum delay among the level-reaching delays may be determined as the coupling transition delay, where each level-reaching delay is a difference between the first transition time and the second transition time for reaching each intermediate signal level.

In calculating the coupling noise of the first signal line VIC due to the second signal lines A1 through A4, a first signal level of the first signal line VIC may be calculated without considering the valid coupling capacitances C1 through C4 of the second signal lines A1 through A4 and a second signal level of the first signal line VIC may be calculated by considering the valid coupling capacitances C1 through C4 of the second signal lines A1 through A4. The coupling noise may be calculated by comparing the first signal level without considering the coupling effect and the second signal level by considering the coupling effect.

In general, the coupling effect may be calculated using static timing analysis (STA) by considering a full chip level dynamic simulation. Alternatively, the coupling effect may be calculated statically with respect to an RC circuit that is provided after the layout of the integrated circuit is completed. Such conventional methods, however, may perform calculations about unreal situations. For example, to obtain the coupling effect on the victim signal line due to the aggressor signal lines, the conventional methods may perform the simulation about the cases when the entire signal levels of the aggressor signal lines transition simultaneously from a first logic level to a second logic level, which may not typically occur in the real or actual operation of the integrated circuit.

In the method of analyzing the coupling effect between the signal lines according to example embodiments, the real signal patterns, which may occur on the signal lines in the integrated circuit, are considered to calculate the coupling noise and the coupling transition delay of the victim line due to the aggressor lines. Thus the coupling effect conforming to real or actual situations may be obtained.

Figure 3:
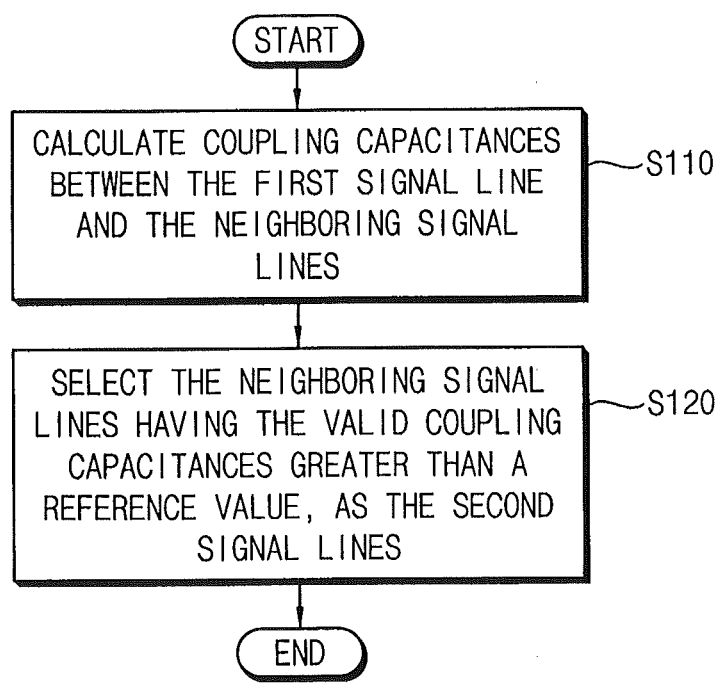
FIG. 3 is a flowchart illustrating a method of selecting signal lines according to example embodiments of the inventive concept.

FIG. 3 is a flowchart illustrating a method of selecting signal lines according to example embodiments of the inventive concept.

Referring to FIGS. 1 and 3, coupling capacitances C1 through C6 between the first signal line VIC and the neighboring signal lines A1 through A6 may be calculated (block S110). For example, the coupling capacitances C1 through C6 may be calculated using simulation programs such as HSPICE, HSIM, FINESIM, etc. The neighboring signal lines having the valid coupling capacitances greater than a reference value may be selected as the second signal lines (block S120). For example, the reference value may be between the fourth coupling capacitance C4 and the fifth coupling capacitance C5. In this case, the four neighboring signal lines A1 through A4 may be selected as the second signal lines.

Figure 4:
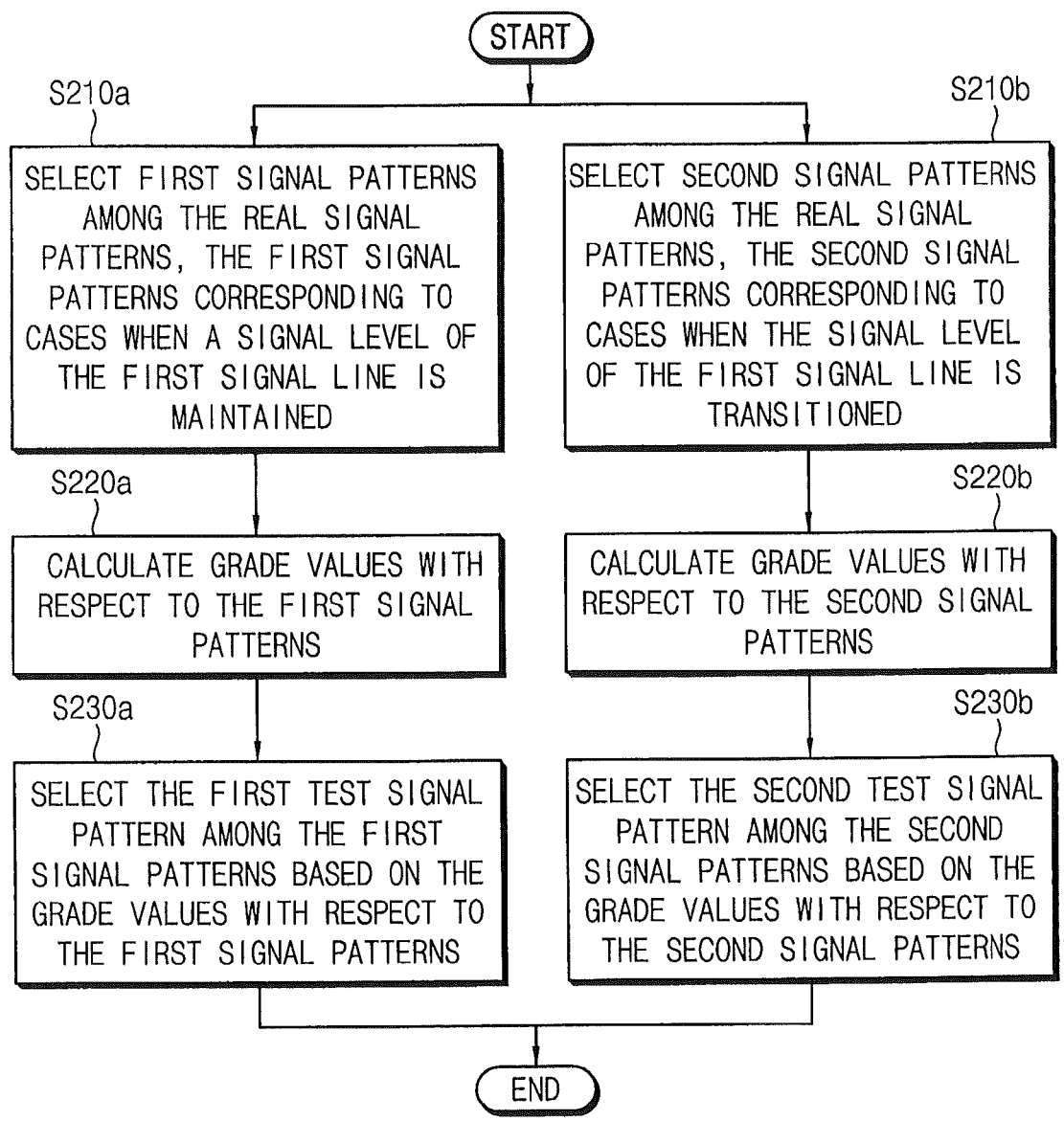
FIG. 4 is a flow chart illustrating a method of selecting test signal patterns according to example embodiments of the inventive concept.

FIG. 4 is a flow chart illustrating a method of selecting test signal patterns according to example embodiments of the inventive concept.

Referring to FIG. 4, first signal patterns may be selected among the real signal patterns (block S210a) such that the first signal patterns correspond to cases when a signal level of the first signal line VIC is maintained. Grade values with respect to the first signal patterns may be calculated (block S220a) such that each grade value indicates coupling interference degree of the second signal lines A1 through A4 on the first signal line VIC with respect to the corresponding signal pattern. The first test signal pattern may be selected among the first signal patterns based on the grade values with respect to the first signal patterns (block S230a).

Second signal patterns may be selected among the real signal patterns (block S210b) such that the second signal patterns correspond to cases when the signal level of the first signal line VIC is transitioned. Grade values with respect to the second signal patterns may be calculated (block S220b) such that each grade value indicates coupling interference degree of the second signal lines A1 through A4 on the first signal line VIC with respect to the corresponding signal pattern. The second test signal pattern may be selected among the second signal patterns based on the grade values with respect to the second signal patterns (block S230b).

Figure 5:
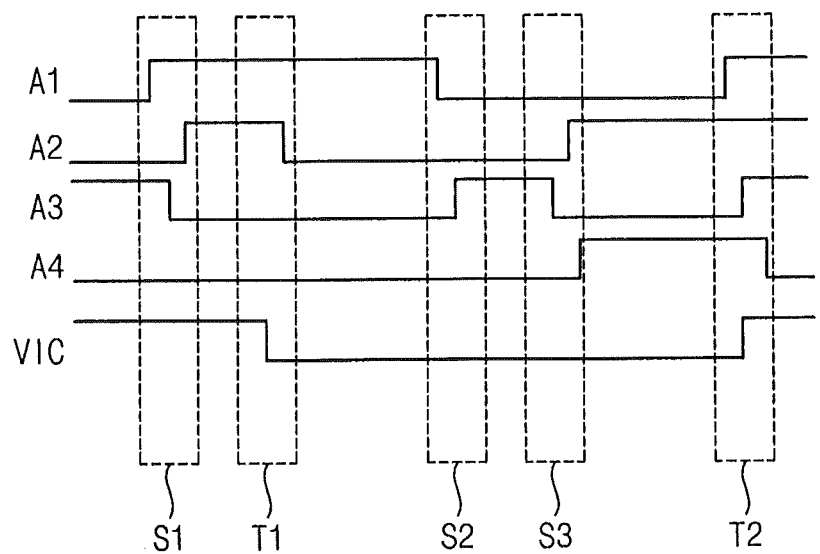
FIG. 5 is a diagram illustrating example signal patterns on signal lines.

FIG. 5 is a diagram illustrating example signal patterns on signal lines.

Referring to FIG. 5, the first signal patterns S1, S2 and S3 correspond to the cases when the signal level of the first signal line VIC is maintained at the logic low level or the logic high level, and the second signal patterns T1 and T2 correspond to the cases when the signal level of the first signal line VIC transitions from the logic high level to the logic low level or vice versa. The time interval of each signal pattern for determining whether the signal level of the first signal line VIC is maintained or transitioned within the time interval may be properly predetermined because the time interval may affect the analysis of the coupling effect.

As illustrated in FIG. 5, the respective signal levels of the second signal lines A1 through A4 may be maintained or transitioned within the time interval of each signal pattern, and the transition timings of the signal levels of the second signal lines A1 through A4 may not be aligned to the same time point.

Figure 6:
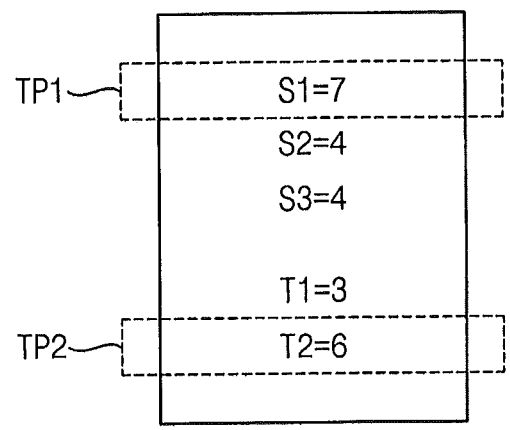
FIG. 6 is a diagram for describing an example of selecting test signal patterns according to example embodiments of the inventive concept.

FIG. 6 is a diagram for describing an example of selecting test signal patterns according to example embodiments of the inventive concept.

As illustrated in FIG. 6, the first signal patterns S1, S2 and S3 may have the grade values of 7, 4, and 4, respectively, and the second signal patterns T1 and T2 may have the grade values of 3 and 6, respectively. As described above, each grade value indicates coupling interference degree of the second signal lines A1 through A4 on the first signal line VIC with respect to the corresponding signal pattern. For example, the grade values may be calculated based on at least one of the coupling capacitances C1 through C4 between the first signal line VIC and the second signal lines A1 through A4, voltage levels of the second signal lines A1 through A4, and signal transition directions (that is, a rising edge or a falling edge) of the second lines A1 through A4.

As described with reference to FIG. 4, the first test signal pattern may be selected among the first signal patterns S1, S2 and S3 based on the grade values of 7, 4, and 4 with respect to the first signal patterns S1, S2 and S3 (block S230a), and the second test signal pattern may be selected among the second signal patterns T1 and T2 based on the grade values of 3 and 6 with respect to the second signal patterns T1 and T2 (block S230b). For example, the one first signal pattern S1 having the greatest grade value of 7 among the first signal patterns S1, S2 and S3 may be selected as the first test signal pattern and the one second signal pattern T2 having the greatest grade value of 6 among the second signal patterns T1 and T2 may be selected as the second test signal pattern. In other words, the signal patterns having the highest coupling interference degree of the second signal lines A1 through A4 on the first signal line VIC may be selected as the test signal patterns.

Figure 7:
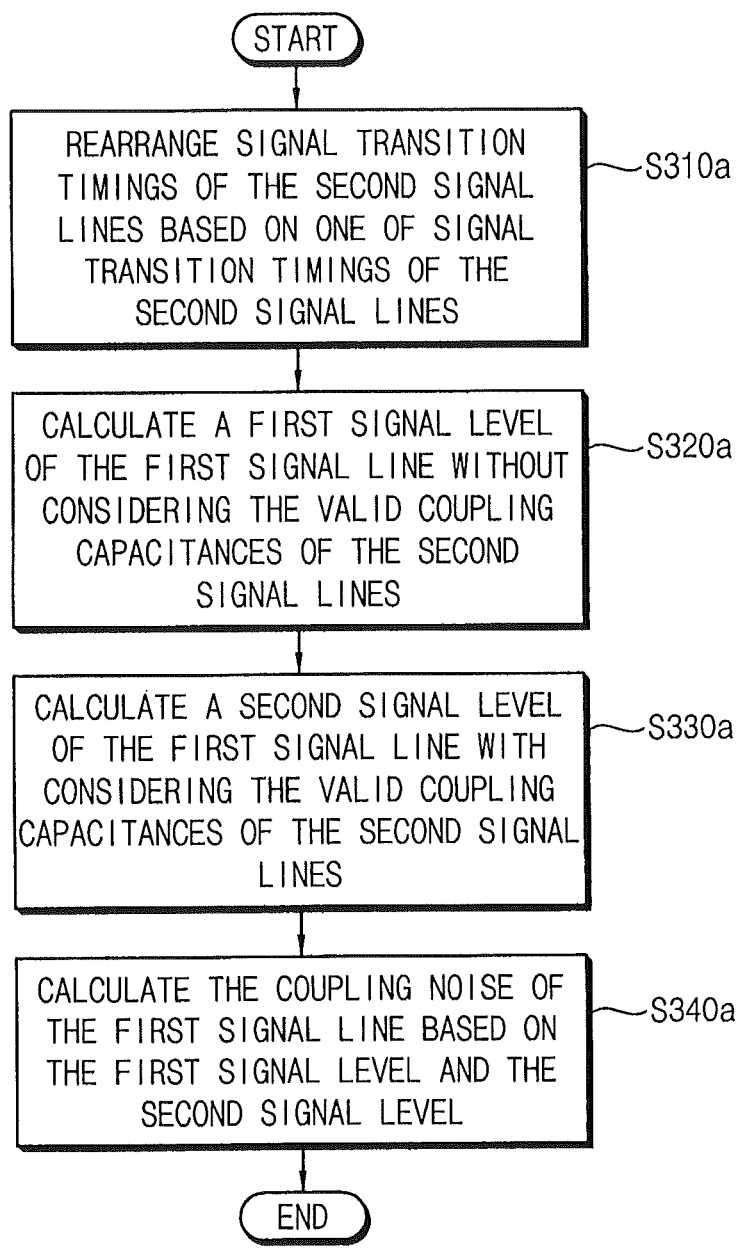
FIG. 7 is a flowchart illustrating a method of calculating a coupling noise according to example embodiments of the inventive concept.

FIG. 7 is a flowchart illustrating a method of calculating a coupling noise according to example embodiments of the inventive concept.

As described above, the coupling noise may be calculated using the first test signal pattern that is selected among the first signal patterns corresponding to the cases when the signal level of the first signal line VIC is maintained.

Referring to FIG. 7, signal transition timings of the second signal lines A1 through A4 may be rearranged based on signal transition timings of one of the second signal lines (block S310a). For example, as described above, when a signal level of the one second signal line A1 transitions from a first signal level (e.g., 0V) to a second signal level (e.g., 5V), the signal transition timings of the second signal lines A1 through A4 may be rearranged to a time point when the signal level of the one second signal line A1 reaches a third signal level (e.g., 2.5V) between the first signal level and the second signal level.

A first signal level of the first signal line VIC may be calculated without considering the valid coupling capacitances C1 through C4 of the second signal lines A1 through A4 (block S320a). A second signal level of the first signal line may be calculated by considering the valid coupling capacitances C1 through C4 of the second signal lines A1 through A4 (block S330a). The coupling noise of the first signal line may be calculated based on the first signal level and the second signal level (block S340a). For example, the coupling noise may be determined as a maximum difference between the first signal level of the first signal line VIC without considering the coupling effect due to the second signal lines A1 through A4 and the second signal level of the first signal line VIC by considering the coupling effect due to the second signal lines A1 through A4.

In calculating the second signal level of the first signal line VIC by considering the valid coupling capacitances C1 through C4 of the second signal lines A1 through A4 (block S330a), the second signal level of the first signal line VIC may be calculated based on the rearranged signal transition timings, that is, based on the rearranged signal patterns on the second signal lines A1 through A4. In some example embodiments, rearranging the signal transition timings of the second signal lines (block S310a) may be omitted. In this case, the second signal level may be calculated based on the original signal patterns on the second signal lines A1 through A4.

Figure 8:
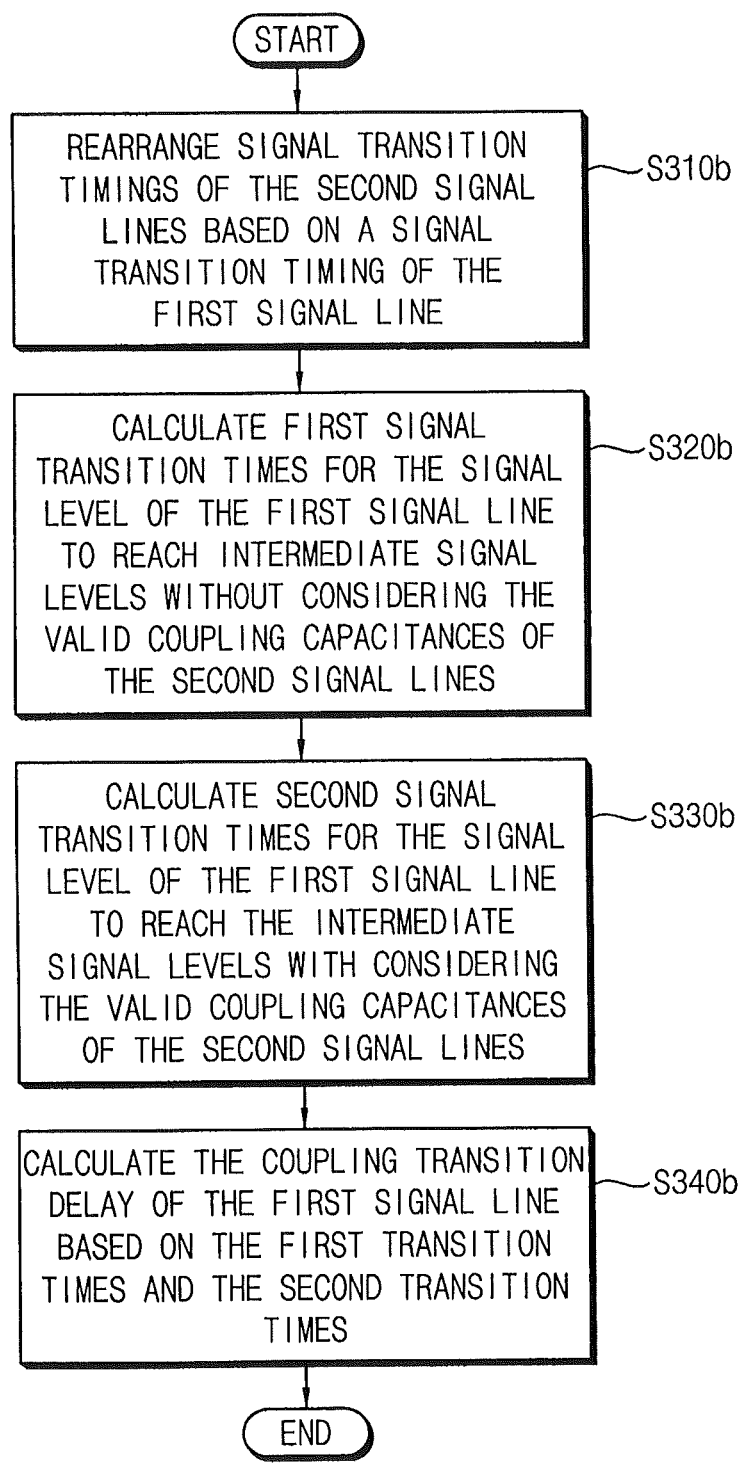
FIG. 8 is a flowchart illustrating a method of calculating a coupling transition delay according to example embodiments of the inventive concept.

FIG. 8 is a flowchart illustrating a method of calculating a coupling transition delay according to example embodiments of the inventive concept.

As described above, the coupling transition delay may be calculated using the second test signal pattern that is selected among the second signal patterns corresponding to the cases when the signal level of the first signal line VIC is transitioned.

Referring to FIG. 8, signal transition timings of the second signal lines A1 through A4 may be rearranged based on a signal transition timing of the first signal line VIC (block S310b). For example, as described above, when a signal level of the first signal line VIC transitions from a first signal level (e.g., 0V) to a second signal level (e.g., 5V), the signal transition timings of the second signal lines A1 through A4 may be rearranged to a time point when the signal level of the first signal line VIC reaches a third signal level (e.g., 2.5V) between the first signal level and the second signal level.

First signal transition times for the signal level of the first signal line VIC to reach intermediate signal levels may be calculated without considering the valid coupling capacitances C1 through C4 of the second signal lines A1 through A1 (block S320b). Second signal transition times for the signal level of the first signal line VIC to reach the intermediate signal levels may be calculated by considering the valid coupling capacitances C1 through C4 of the second signal lines A1 through A4 (block S330b). For example, when the signal level of the first signal line VIC transitions from the first signal level of 0V to the second signal level of 5V, the three intermediate signal levels may be determined as 1V, 2.5V, and 4V between the first signal level and the second signal level. In this case, the first signal transition time and the second signal transition time may be calculated with respect to each of the intermediate signal levels of 1V, 2.5V, and 4V, respectively.

The coupling transition delay of the first signal line VIC may be calculated based on the first transition times and the second transition times (block S340b). A plurality of level-reaching delays may be calculated where each level-reaching delay is a difference between the first transition time and the second transition time for reaching each intermediate signal level, and a maximum delay among the level-reaching delays may be determined as the coupling transition delay. For example, three level-reaching delays may be calculated with respect to the three intermediate signal levels of 1V, 2.5V, and 4V between the first signal level of 0V and the second signal level of 5V, and the maximum delay among the three level-reaching delays may be determined as the coupling transition delay.

In calculating the second signal transition times for the signal level of the first signal line VIC by considering the valid coupling capacitances C1 through C4 of the second signal lines A1 through A4 (block S330b), the second signal transition times to the respective intermediate signal levels may be calculated based on the rearranged signal transition timings, that is, based on the rearranged signal patterns on the second signal lines A1 through A4. In some example embodiments, rearranging the signal transition timings of the second signal lines (block S310b) may be omitted. In this case, the second signal transition times may be calculated based on the original signal patterns on the second signal lines A1 through A4.

Figure 9:
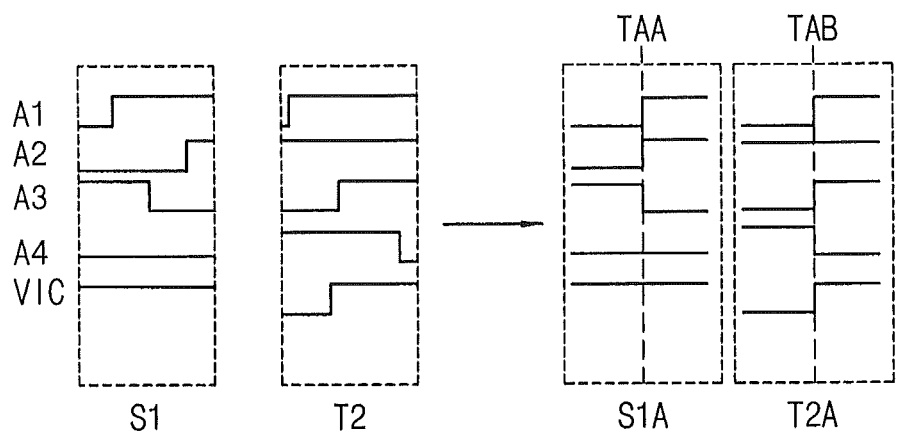
FIG. 9 is a diagram for describing an example of rearranging signal transition timings according to example embodiments of the inventive concept.

FIG. 9 is a diagram for describing an example of rearranging signal transition timings according to example embodiments of the inventive concept.

Referring to FIG. 9, the first test signal pattern S1 and the second test signal pattern T2 may include the signal transitions on the second signal lines A1 through A4, which have different transition timings from each other.

As described above, the signal transition timings of the second signal lines A1 through A4 may be rearranged based on a signal transition timing of the first signal line VIC or one of the signal transition timings of the second signal lines A1 through A4. For example, the signal transition timings of the second signal lines A1 through A4 in the first test signal pattern S1 may be aligned to one signal transition timing TAA of the second signal lines A1 through A4, and the signal transition timings of the second signal lines A1 through A4 in the second test signal pattern T2 may be aligned to the signal transition timing TAB of the first signal line VIC. The rearranged test signal patterns S1A and T2A may be used in calculating the coupling noise and the coupling transition delay.

Figure 10:
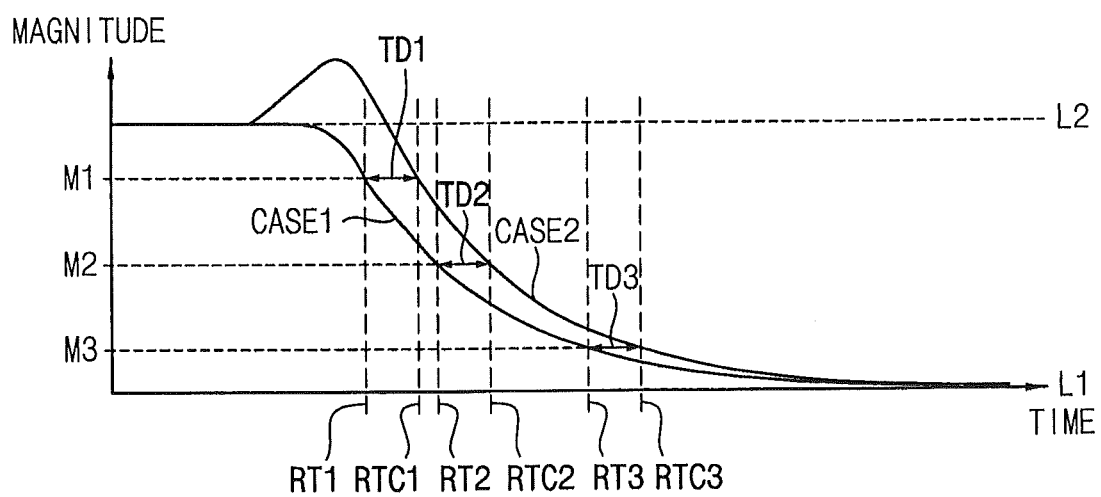
FIG. 10 is a diagram for describing an example of calculating a coupling transition delay according to example embodiments of the inventive concept.

FIG. 10 is a diagram for describing an example of calculating a coupling transition delay according to example embodiments of the inventive concept.

In FIG. 10, CASE1 represents a transition waveform of the first signal line VIC without considering the valid capacitances C1 through C4 of the second signal lines A1 through A4, and CASE2 represents a transition waveform of the first signal line VIC by considering the valid capacitances C1 through C4 of the second signal lines A1 through A4.

As illustrated in FIG. 10, the signal level of the first signal line VIC may transition from the logic high level L2 (e.g., 5V) to the logic low level L1 (e.g., 0V). For example, three intermediate signal levels M1 (e.g., 4V), M2 (e.g., 2.5V) and M3 (e.g., 1V) may be selected. The first signal transition times RT1, RT2, and RT3 for the signal level of the first signal line VIC to reach the intermediate signal levels M1, M2, and M3 may be calculated without considering the valid coupling capacitances C1 through C4 of the second signal lines A1 through A1 (CASE1). Also the second signal transition times RTC1, RTC2, and RTC3 for the signal level of the first signal line VIC to reach the intermediate signal levels M1, M2, and M3 may be calculated by considering the valid coupling capacitances C1 through C4 of the second signal lines A1 through A4 (CASE2). The three level-reaching delays TD1, TD2, and TD3 may be calculated with respect to the three intermediate signal levels M1, M2, and M3, and the maximum delay among the three level-reaching delays TD1, TD2, and TD3 may be determined as the coupling transition delay of the first signal line VIC due to the second signal lines A1 through A4.

Figure 11:
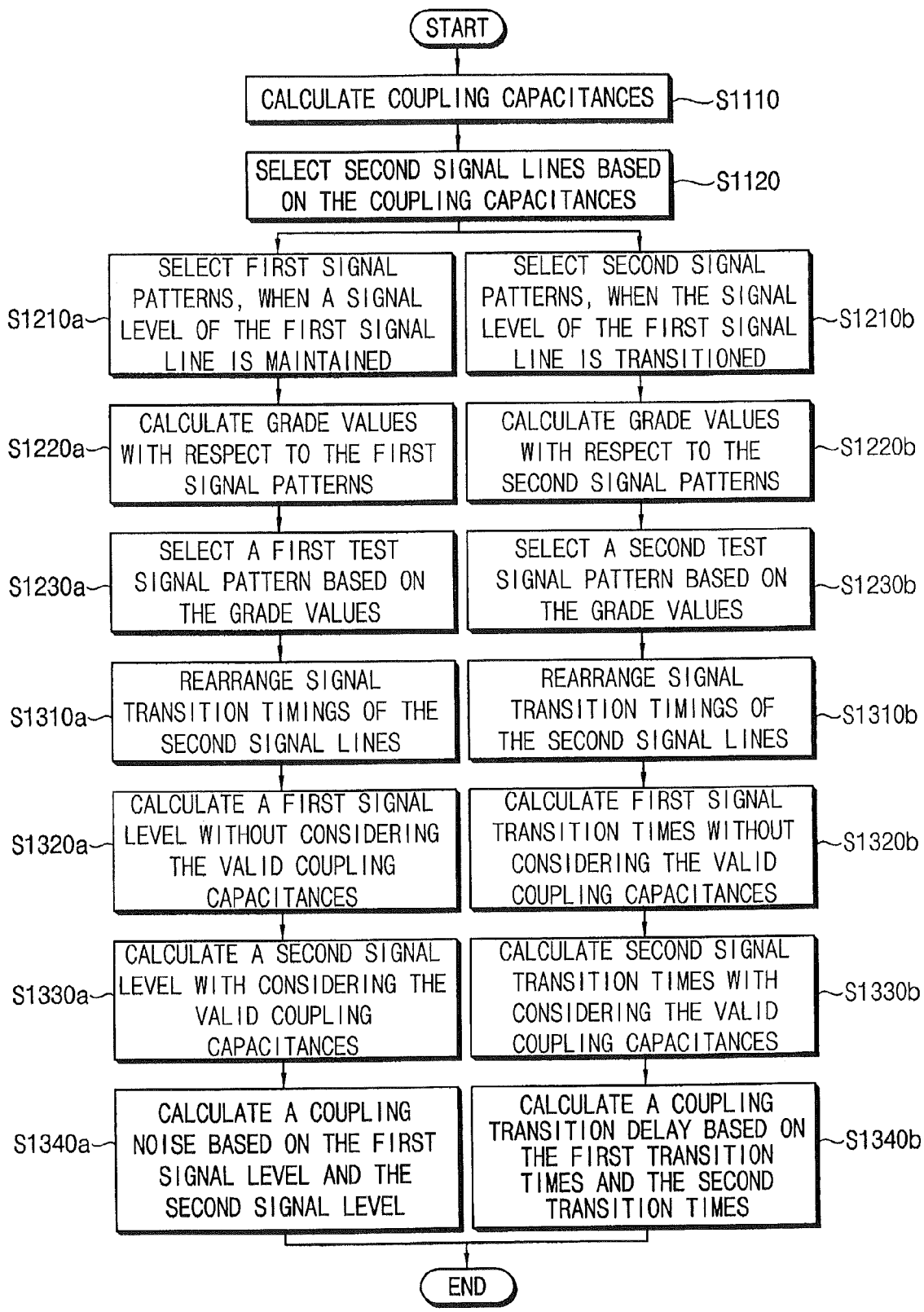
FIG. 11 is a flowchart illustrating a method of analyzing coupling effect between signal lines in an integrated circuit according to example embodiments of the inventive concept.

FIG. 11 is a flowchart illustrating a method of analyzing coupling effect between signal lines in an integrated circuit according to example embodiments of the inventive concept. Description of subject matter described above with reference to FIGS. 1 through 10 may be omitted.

Referring to FIGS. 1 and 11, to analyze coupling effect between signal lines, coupling capacitances C1 through C6 between the first signal line VIC and the neighboring signal lines A1 through A6 may be calculated (block S1110). Second signal lines A1 through A4 may be selected among the neighboring signal lines A1 through A6 based on the coupling capacitances C1 through C6 (block S1120). For example, the neighboring signal lines having valid coupling capacitances greater than a reference value may be selected as the second signal lines.

First signal patterns may be selected among the real signal patterns according to a function of the integrated circuit such that the first signal patterns correspond to cases when a signal level of the first signal line VIC is maintained (block S1210a). The real signal patterns according to the function of the integrated circuit may be combinations of signal waveforms that may occur on the first signal line VIC and the second signal lines A1 through A4 while the integrated circuit performs normal operations. Grade values with respect to the first signal patterns may be calculated (block S1220a) such that each grade value indicates coupling interference degree of the second signal lines A1 through A4 on the first signal line VIC with respect to the corresponding signal pattern. For example, the grade values may be calculated based on at least one of the coupling capacitances C1 through C4 between the first signal line VIC and the second signal lines A1 through A4, voltage levels of the second signal lines A1 through A4, and signal transition directions (that is, a rising edge or a falling edge) of the second lines A1 through A4. The first test signal pattern may be selected among the first signal patterns based on the grade values with respect to the first signal patterns (block S1230a).

The coupling noise of the first signal line VIC due to the second signal lines A1 through A4 may be obtained based on the first test signal pattern. Signal transition timings of the second signal lines A1 through A4 may be rearranged (block S1310a) based on one of signal transition timings of the second signal lines. For example, as described above, when the signal level of the one second signal line A1 transitions from a first signal level (e.g., 0V) to a second signal level (e.g., 5V), the signal transition timings of the second signal lines A1 through A4 may be rearranged to a time point when the signal level of the one second signal line A1 reaches a third signal level (e.g., 2.5V) between the first signal level and the second signal level.

The simulation of the integrated circuit may be performed based on the rearranged signal transition timings. A first signal level of the first signal line VIC may be calculated without considering the valid coupling capacitances C1 through C4 of the second signal lines A1 through A4 (block S1320a). A second signal level of the first signal line may be calculated by considering the valid coupling capacitances C1 through C4 of the second signal lines A1 through A4 (block S1330a). The coupling noise of the first signal line VIC may be calculated based on the first signal level and the second signal level (block S1340a).

Second signal patterns may be selected among the real signal patterns such that the second signal patterns correspond to cases when the signal level of the first signal line VIC is transitioned (block S1210b). Grade values with respect to the second signal patterns may be calculated (block S1220b) such that each grade value indicates coupling interference degree of the second signal lines A1 through A4 on the first signal line VIC with respect to the corresponding signal pattern. The second test signal pattern may be selected among the second signal patterns based on the grade values with respect to the second signal patterns (block S1230b).

The coupling transition delay of the first signal line VIC due to the second signal lines A1 through A4 may be obtained based on the second test signal pattern. Signal transition timings of the second signal lines A1 through A4 may be rearranged (block S1310b) based on a signal transition timing of the first signal line VIC. For example, as described above, when a signal level of the first signal line VIC transitions from a first signal level (e.g., 0V) to a second signal level (e.g., 5V), the signal transition timings of the second signal lines A1 through A4 may be rearranged to a time point when the signal level of the first signal line VIC reaches a third signal level (e.g., 2.5V) between the first signal level and the second signal level.

The simulation of the integrated circuit may be performed based on the rearranged signal transition timings. First signal transition times for the signal level of the first signal line VIC to reach intermediate signal levels may be calculated without considering the valid coupling capacitances C1 through C4 of the second signal lines A1 through A1 (block S1320b). Second signal transition times for the signal level of the first signal line VIC to reach the intermediate signal levels may be calculated by considering the valid coupling capacitances C1 through C4 of the second signal lines A1 through A4 (block S1330b). For example, when the signal level of the first signal line VIC transitions from the first signal level of 0V to the second signal level of 5V, the three intermediate signal levels may be determined as 1V, 2.5V, and 4V between the first signal level and the second signal level. In this case, the first signal transition time and the second transition time may be calculated with respect to each of the intermediate signal levels of 1V, 2.5V, and 4V, respectively. The coupling transition delay of the first signal line VIC may be calculated based on the first transition times and the second transition times (block S1340b). A plurality of level-reaching delays may be calculated where each level-reaching delay is a difference between the first transition time and the second transition time for reaching each intermediate signal level, and a maximum delay among the level-reaching delays may be determined as the coupling transition delay. For example, three level-reaching delays may be calculated with respect to the three intermediate signal levels of 1V, 2.5V, and 4V between the first signal level of 0V and the second signal level of 5V, and the maximum delay among the three level-reaching delays may be determined as the coupling transition delay.

As described above, rearranging the signal transition timings (blocks S1310a and 1310b) may be omitted. In this case, the simulation of the integrated circuit may be performed based on the original signal patterns instead of the rearranged signal patterns.

As such, in the method of analyzing the coupling effect between the signal lines according to example embodiments, the real or actual signal patterns, which may occur on the signal lines in the integrated circuit, are considered to calculate the coupling noise and the coupling transition delay of the victim line due to the aggressor lines. Thus the coupling effect conforming to real or actual situations may be obtained.

Figure 12:
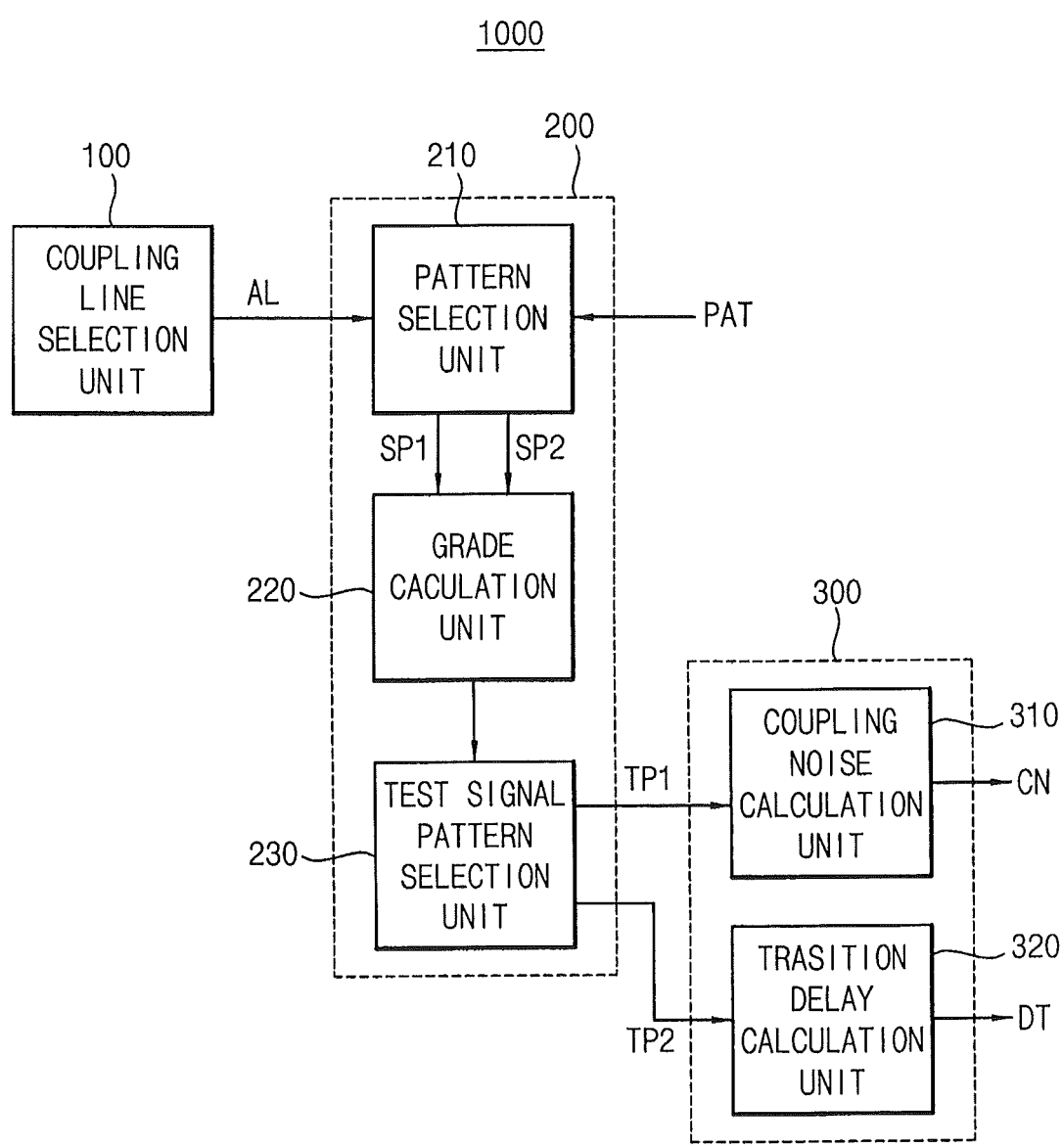
FIG. 12 is a block diagram illustrating a device of analyzing coupling effect between signal lines in an integrated circuit according to some example embodiments of the inventive concept.

FIG. 12 is a block diagram illustrating a device for analyzing coupling effect between signal lines in an integrated circuit according to some example embodiments of the inventive concept.

Referring to FIGS. 1, 11, and 12, a device 1000 for analyzing coupling effect may include a coupling line selection unit 100, a test pattern selection unit 200, and a coupling effect calculation unit 300. The device 1000 may be implemented with hardware, software, or a combination of hardware and software.

The coupling line selection unit 100 may calculate coupling capacitances C1 through C6 between the first signal line VIC and the neighboring signal lines A1 through A6 (block S1110). The coupling line selection unit 100 may select second signal lines A1 through A4 among the neighboring signal lines A1 through A6 based on the coupling capacitances C1 through C6 (block S1120).

The test pattern selection unit 100 may include a pattern selection unit 210, a grade calculation unit 220, and a test signal pattern selection unit 230. The pattern selection unit 210 may receive real signal patterns PAT from an external device or an external database. The real signal patterns PAT may be combinations of signal waveforms that may occur on the first signal line VIC and the second signal lines A1 through A4 while the integrated circuit performs normal operations. The pattern selection unit 210 may select first signal patterns SP1 among the real or actual signal patterns PAT such that the first signal patterns SP1 correspond to cases when the signal level of the first signal line VIC is maintained (block S1210a). In addition, the pattern selection unit 210 may select second signal patterns SP2 among the real or actual signal patterns PAT such that the second signal patterns SP2 correspond to cases when the signal level of the first signal line VIC is transitioned (block S1210b).

The grade calculation unit 220 may calculate grade values with respect to the first signal patterns SP1 (block S1220a) and grade values with respect to the second signal patterns SP2 (block S1220b), respectively. The grade values may indicate coupling interference degree of the second signal lines A1 through A4 on the first signal line VIC with respect to the corresponding signal patterns.

The test signal pattern selection unit 230 may select the first test signal pattern TP1 among the first signal patterns SP1 based on the grade values with respect to the first signal patterns SP1 (block S1230a). In addition, the test signal pattern selection unit 230 may select the second test signal pattern TP2 among the second signal patterns SP2 based on the grade values with respect to the second signal patterns SP2 (block S1230b). The first test signal pattern TP1 and the second test signal pattern TP2 may be provided to the coupling effect calculation unit 300.

The coupling effect calculation unit 300 may include a coupling noise calculation unit 310 and a transition delay calculation unit 320.

The coupling noise calculation unit 310, based on the first test signal pattern TP1, may calculate a first signal level of the first signal line VIC without considering the valid coupling capacitances C1 through C4 of the second signal lines A1 through A4 (block S1320a). In addition, the coupling noise calculation unit 310, based on the first test signal pattern TP1, may calculate a second signal level of the first signal line by considering the valid coupling capacitances C1 through C4 of the second signal lines A1 through A4 (block S1330a). The coupling noise calculation unit 310 may calculate the coupling noise CN of the first signal line VIC based on the first signal level and the second signal level (block S1340a).

The transition delay calculation unit 320, based on the second test signal pattern TP2, may calculate first signal transition times for the signal level of the first signal line VIC to reach intermediate signal levels without considering the valid coupling capacitances C1 through C4 of the second signal lines A1 through A1 (block S1320b). In addition, the transition delay calculation unit 320, based on the second test signal pattern TP2, may calculate second signal transition times for the signal level of the first signal line VIC to reach the intermediate signal levels by considering the valid coupling capacitances C1 through C4 of the second signal lines A1 through A4 (block S1330b). The transition delay calculation unit 320 may calculate the coupling transition delay DT of the first signal line VIC based on the first transition times and the second transition times (block S1340b). As described with reference to FIG. 10, the plurality of the level-reaching delays TD1, TD2, and TD3 may be calculated with respect to the intermediate signal levels M1, M2, and M3, and the maximum delay among the level-reaching delays TD1, TD2, and TD3 may be determined as the coupling transition delay DT of the first signal line VIC due to the second signal lines A1 through A4.

The coupling line selection unit 100 may perform the processes of FIG. 3, the test pattern selection unit 200 may perform the processes of FIG. 4, and the coupling effect calculation unit 300 may perform the processes of FIGS. 7 and 8 according to some example embodiments of the inventive concept.

As such, the device 1000 for analyzing the coupling effect according to example embodiments may consider the real or actual signal patterns, which may occur on the signal lines in the integrated circuit, to calculate the coupling noise and the coupling transition delay of the victim line due to the aggressor lines. Thus the coupling effect conforming to real or actual situations may be obtained.

Figure 13:
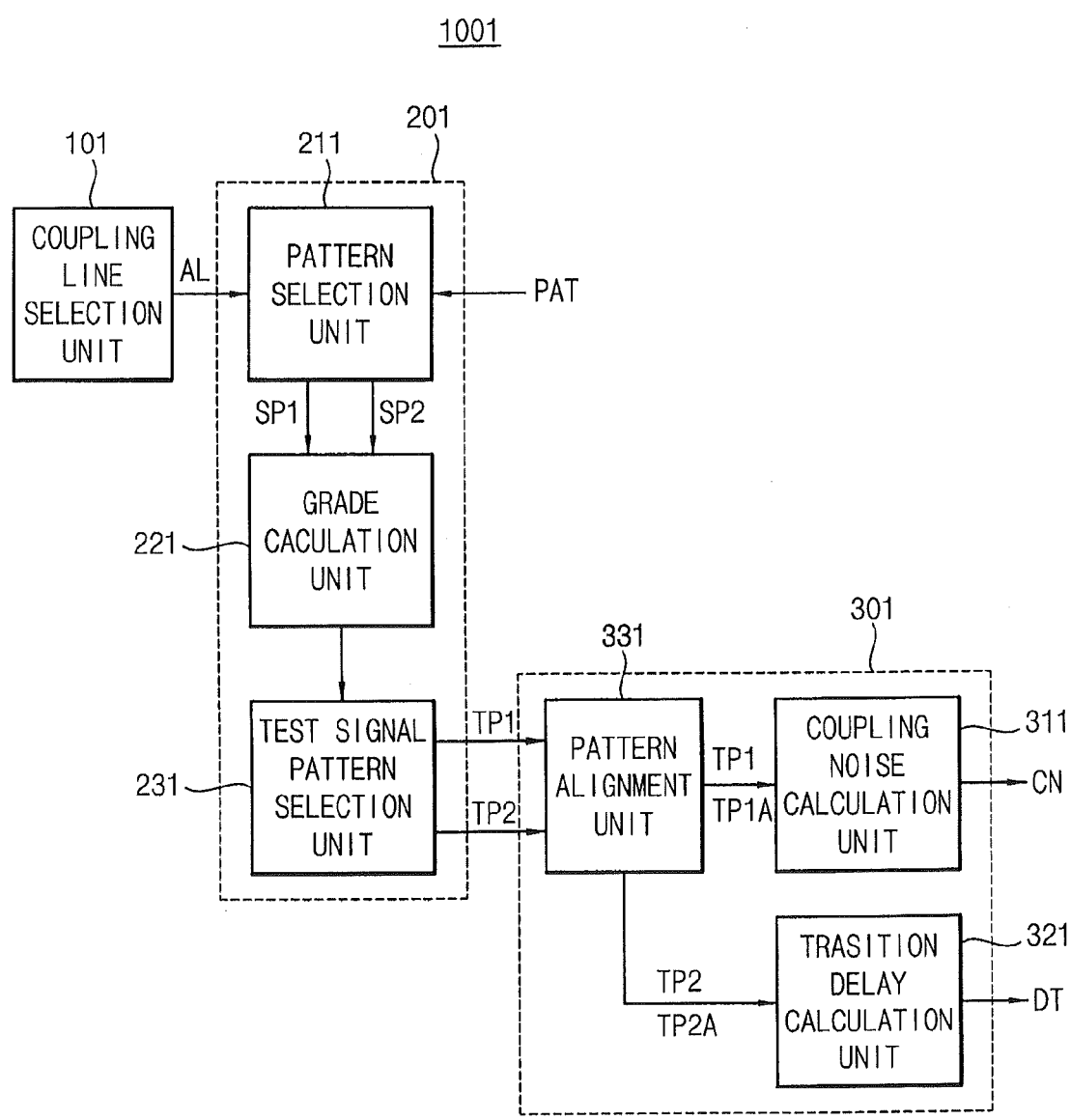
FIG. 13 is a block diagram illustrating a device of analyzing coupling effect between signal lines in an integrated circuit according to other example embodiments of the inventive concept.

FIG. 13 is a block diagram illustrating a device for analyzing coupling effect between signal lines in an integrated circuit according to other example embodiments of the inventive concept.

Referring to FIGS. 1, 11, and 13, a device 1001 for analyzing coupling effect may include a coupling line selection unit 101, a test pattern selection unit 201, and a coupling effect calculation unit 301. The coupling line selection unit 101 and the test pattern selection unit 201 may be similar to those of FIG. 12 and the descriptions thereof will not be repeated.

The coupling effect calculation unit 301 may include a coupling noise calculation unit 310, a transition delay calculation unit 320, and a pattern alignment unit 331.

The pattern alignment unit 331 may generate a first rearranged test signal pattern TP1A by rearranging signal transition timings of the second signal lines A1 through A4 (block S1310a) based on one of signal transition timings of the second signal lines. In addition, the pattern alignment unit 331 may generate a second rearranged test signal pattern TP2A by rearranging signal transition timings of the second signal lines A1 through A4 (block S1310b) based on a signal transition timing of the first signal line VIC. The first test signal pattern TP1, the second test signal pattern TP2, the first rearranged test signal pattern TP1A, and the second rearranged test signal pattern TP2A may be provided to the coupling noise calculation unit 311 to perform the simulation of the integrated circuit.

The coupling noise calculation unit 311, based on the first test signal pattern TP1, may calculate a first signal level of the first signal line VIC without considering the valid coupling capacitances C1 through C4 of the second signal lines A1 through A4 (block S1320a). In addition, the coupling noise calculation unit 311, based on the first test signal pattern TP1 or the first rearranged test signal pattern TP1A, may calculate a second signal level of the first signal line by considering the valid coupling capacitances C1 through C4 of the second signal lines A1 through A4 (block S1330a). The coupling noise calculation unit 311 may calculate the coupling noise CN of the first signal line VIC based on the first signal level and the second signal level (block S1340a).

The transition delay calculation unit 321, based on the second test signal pattern TP2, may calculate first signal transition times for the signal level of the first signal line VIC to reach intermediate signal levels without considering the valid coupling capacitances C1 through C4 of the second signal lines A1 through A1 (block S1320b). In addition, the transition delay calculation unit 321, based on the second test signal pattern TP2 or the second rearranged test signal pattern TP2A, may calculate second signal transition times for the signal level of the first signal line VIC to reach the intermediate signal levels by considering the valid coupling capacitances C1 through C4 of the second signal lines A1 through A4 (block S1330b). The transition delay calculation unit 321 may calculate the coupling transition delay DT of the first signal line VIC based on the first transition times and the second transition times (block S1340b). As described with reference to FIG. 10, the plurality of the level-reaching delays TD1, TD2, and TD3 may be calculated with respect to the intermediate signal levels M1, M2, and M3, and the maximum delay among the level-reaching delays TD1, TD2, and TD3 may be determined as the coupling transition delay DT of the first signal line VIC due to the second signal lines A1 through A4.

The coupling line selection unit 101 may perform the processes of FIG. 3, the test pattern selection unit 201 may perform the processes of FIG. 4, and the coupling effect calculation unit 301 may perform the processes of FIGS. 7 and 8 according to some example embodiments of the inventive concept.

As such, the device 1001 for analyzing the coupling effect according to example embodiments may consider the real or actual signal patterns, which may occur on the signal lines in the integrated circuit, to calculate the coupling noise and the coupling transition delay of the victim line due to the aggressor lines. Thus the coupling effect conforming to real or actual situations may be obtained.

The processes in the blocks included in the flowcharts of FIGS. 2, 3, 4, 7, 8 and 11 may be implemented variously based on hardware, software or a combination of hardware and software. At least some portions of the processes may be performed based on software through application programs that may be executed by a general purpose processor (GPP), a special purpose processor mounted on a computer device and on the like.

The above-described embodiments may be used in analyzing the coupling effect, such as the coupling noise, the coupling transition delay, etc. between the signal lines in the integrated circuit. Particularly, a more exact analysis may be obtained through the embodiments when the signal levels on the neighboring signal lines have regular patterns that may be predictable.

Features and/or embodiments described herein may be applied to any photo-detection device, such as a three-dimensional image sensor providing image information and depth information about an object. For example, one or more example embodiments may be applied to a computing system, such as a face recognition security system, a desktop computer, a laptop computer, a digital camera, a three-dimensional camera, a video camcorder, a cellular phone, a smart phone, a personal digital assistant (PDA), a scanner, a video phone, a digital television, a navigation system, an observation system, an auto-focus system, a tracking system, a motion capture system, an image-stabilizing system, etc.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of analyzing coupling effect between signal lines in an integrated circuit, comprising:
    selecting second signal lines among neighboring signal lines near a first signal line, the second signal lines having valid coupling capacitances with respect to the first signal line;
    selecting test signal patterns of the first signal line and the second signal lines among real signal patterns according to a function of the integrated circuit; and
    calculating at least one of a coupling noise and a coupling transition delay of the first signal line based on the test signal patterns;
    wherein calculating the at least one of the coupling noise and the coupling transition delay of the first signal line comprises:
    when a signal level of the first signal line transitions from a first signal level to a second signal level through a plurality of intermediate signal levels between the first signal level and the second signal level, calculating first signal transition times for the signal level of the first signal line to reach the intermediate signal levels without considering the valid coupling capacitances of the second signal lines;
    calculating second signal transition times for the signal level of the first signal line to reach the intermediate signal levels by considering the valid coupling capacitances of the second signal lines; and
    calculating the coupling transition delay of the first signal line based on the first transition times and the second transition times.

2. The method of claim 1, wherein selecting the second signal lines comprises:
    calculating coupling capacitances between the first signal line and the neighboring signal lines; and
    selecting the neighboring signal lines having the valid coupling capacitances greater than a reference value, as the second signal lines.

3. The method of claim 1, wherein selecting the test signal patterns comprises:
    selecting first signal patterns among the real signal patterns, the first signal patterns corresponding to cases when a signal level of the first signal line is maintained;
    selecting second signal patterns among the real signal patterns, the second signal patterns corresponding to cases when the signal level of the first signal line is transitioned;
    selecting a first test signal pattern among the first signal patterns; and
    selecting a second test signal pattern among the second signal patterns.

4. The method of claim 3, wherein each of selecting the first test signal pattern and selecting the second test signal pattern comprises:
    calculating grade values with respect to the first signal patterns and the second signal patterns, each of the grade values indicating coupling interference degree of the second signal lines on the first signal line; and
    selecting the first test signal pattern and the second test signal pattern based on the grade values.

5. The method of claim 4, wherein the grade values are calculated based on at least one of the coupling capacitances between the first signal line and the second signal lines, voltage levels of the second signal lines, and signal transition directions of the second lines.

6. The method of claim 3, wherein calculating the at least one of the coupling noise and the coupling transition delay of the first signal line comprises:
    calculating the coupling noise of the first signal line based on the first test signal pattern; and
    calculating the coupling transition delay of the first signal line based on the first transition times, the second transition times, and the second test signal pattern.

7. The method of claim 1, wherein each of the first test signal pattern and the second test signal pattern comprises signal level information and signal transition information of the first signal line and the second signal lines.

8. The method of claim 1, wherein the test signal patterns comprise a first test signal pattern and a second test signal pattern, the first test signal pattern is selected among first signal patterns corresponding to cases when a signal level of the first signal line is maintained, and the second test signal pattern is selected among second signal patterns corresponding to cases when the signal level of the first signal line transitions.

9. The method of claim 8, wherein calculating the at least one of the coupling noise and the coupling transition delay of the first signal line comprises:
    calculating the coupling noise of the first signal line based on the first test signal pattern; and
    calculating the coupling transition delay of the first signal line based on the first transition times, the second transition times, and the second test signal pattern.

10. The method of claim 1, wherein calculating the at least one of the coupling noise and the coupling transition delay of the first signal line comprises:
    rearranging signal transition timings of the second signal lines based on a signal transition timing of the first signal line; and
    calculating the coupling transition delay of the first signal line based on the first transition times, the second transition times, and the rearranged signal transition timings.

11. The method of claim 10, wherein when a signal level of the first signal line transitions from a first signal level to a second signal level, the signal transition timings of the second signal lines are rearranged to a time point when the signal level of the first signal line reaches a third signal level between the first signal level and the second signal level.

12. The method of claim 1, wherein when a signal level of the first signal line transitions from a first signal level to a second signal level through a plurality of intermediate signal levels between the first signal level and the second signal level, the coupling transition delay corresponds to a maximum delay among a plurality of level-reaching delays with respect to the intermediate signal levels.

13. The method of claim 1, wherein calculating the coupling transition delay of the first signal line based on the first transition times and the second transition times comprises:
    calculating a plurality of level-reaching delays, each level-reaching delay being a difference between the first transition time and the second transition time for reaching each intermediate signal level; and
    determining a maximum delay among the level-reaching delays as the coupling transition delay.

14. The method of claim 1, wherein the real signal patterns according to the function of the integrated circuit are combinations of signal waveforms that occur on the first signal line and the second signal lines while the integrated circuit performs a normal operation.

15. A method of analyzing coupling effect between signal lines in an integrated circuit, comprising:
   selecting second signal lines among neighboring signal lines near a first signal line based on coupling capacitances between the first signal line and the neighboring signal lines;
   selecting first signal patterns and second signal patterns of the first signal line and the second signal lines among real signal patterns according to a function of the integrated circuit, the first signal patterns corresponding to cases when a signal level of the first signal line is maintained, the second signal patterns corresponding to cases when the signal level of the first signal line is transitioned;
   selecting a first test signal pattern among the first signal patterns and a second test signal pattern among the second signal patterns;
   calculating a coupling noise of the first signal line based on the first test signal pattern and a coupling transition delay of the first signal line based on the second test signal pattern;
   wherein calculating the coupling noise comprises:
   aligning test signal transition timings for the group of the second signal lines based on a transition in one of the second signal patterns associated with one of the group of the second signal lines;
   calculating a first signal level for the first signal line while excluding the coupling capacitance of the second signal lines with respect to the first signal line based on the aligned test signal transition timings;
   calculating a second signal level for the first signal line while including the coupling capacitance of the second signal lines with respect to the first signal line based on the aligned test signal transition timings; and
   calculating the coupling noise based on the first test signal pattern and the first and second signal levels.

16. A method of analyzing coupling effect between signal lines in an integrated circuit, comprising:
   providing a first signal line;
   providing a plurality of second signal lines, the second signal lines being capacitively coupled to the first signal line;
   selecting a group of the second signal lines having a coupling capacitance with respect to the first signal line that is greater than a reference value;
   obtaining test signal patterns for the first signal line and the group of second signal lines based on a normal operation of the integrated circuit; and
   determining a coupling noise and a coupling transition delay associated with the first signal line based on the test signal patterns;
   wherein determining the coupling noise comprises:
   aligning test signal transition timings for the group of the second signal lines based on a transition in one of the test signal patterns associated with one of the group of the second signal lines;
   calculating a first signal level for the first signal line while excluding the coupling capacitance of the second signal lines with respect to the first signal line based on the aligned test signal transition timings;
   calculating a second signal level for the first signal line while including the coupling capacitance of the second signal lines with respect to the first signal line based on the aligned test signal transition timings; and
   determining the coupling noise based on the first and second signal levels.

17. The method of claim 16, wherein obtaining the test signal patterns comprises:
   selecting a first test signal pattern based on a coupling interference degree determined for each of the group of the second signal lines on the first signal line when a signal level of the first signal line is maintained at a constant level; and
   selecting a second test signal pattern based on a coupling interference degree determined for each of the group of the second signal lines on the first signal line when a signal level of the first signal line transitions.

18. A method of analyzing coupling effect between signal lines in an integrated circuit, comprising:
   providing a first signal line;
   providing a plurality of second signal lines, the second signal lines being capacitively coupled to the first signal line;
   selecting a group of the second signal lines having a coupling capacitance with respect to the first signal line that is greater than a reference value;
   obtaining test signal patterns for the first signal line and the group of second signal lines based on a normal operation of the integrated circuit; and
   determining a coupling noise and a coupling transition delay associated with the first signal line based on the test signal patterns;
   wherein determining the coupling transition delay comprises:
   aligning test signal transition timings for the group of the second signal lines based on a transition in the test signal pattern associated with the first signal line;
   calculating a first signal transition time for the signal level of the first signal line to reach an intermediate level between a maximum and a minimum level while excluding the coupling capacitance of the second signal lines with respect to the first signal line based on the aligned test signal transition timings;
   calculating a second signal transition time for the signal level of the first signal line to reach the intermediate level between the maximum and the minimum level while including the coupling capacitance of the second signal lines with respect to the first signal line based on the aligned test signal transition timings; and
   calculating the coupling transition delay based on the first and second signal transition times.

* * * * *